_(12)_ United States Patent
Biran et al.

(10) Patent No.: US 7,834,781 B2
(45) Date of Patent: Nov. 16, 2010

(54) METHOD OF CONSTRUCTING AN APPROXIMATED DYNAMIC HUFFMAN TABLE FOR USE IN DATA COMPRESSION

(75) Inventors: Giora Biran, Zichron-Yaakov (IL); Hubertus Franke, Cortlandt Manor, NY (US); Amit Golander, Tel-Aviv (IL); Hao Yu, Valhalla, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 12/418,896

(22) Filed: Apr. 6, 2009

(65) Prior Publication Data

US 2010/0253556 A1    Oct. 7, 2010

(51) Int. Cl.
*H03M 7/40* (2006.01)
(52) U.S. Cl. ......................................... 341/65; 382/239
(58) Field of Classification Search ............. 341/65–90; 382/239–247
See application file for complete search history.

(56) References Cited

U.S. PATENT DOCUMENTS 5,748,121 A * 5/1998 Romriell ..................... 341/65
5,848,195 A * 12/1998 Romriell ..................... 382/246
5,959,560 A    9/1999 Said et al.
5,970,177 A * 10/1999 Chinnock ................... 382/244
6,701,020 B2 * 3/2004 Chrysafis et al. ............ 382/239
6,903,668 B1 * 6/2005 Dror et al. .................... 341/67
7,609,182 B2 * 10/2009 Owsley et al. ................ 341/65
7,692,561 B2 * 4/2010 Biran et al. ................... 341/51

* cited by examiner

*Primary Examiner*—Lam T Mai
(74) *Attorney, Agent, or Firm*—Zaretsky & Associates, PC (57) ABSTRACT

A novel and useful method of constructing a fast approximation of a dynamic Huffman table from a data sample comprising a subset of data to be compressed. The frequency of incidence of each symbol in the sample is calculated, and the symbols are then allocated to predefined bins based on their frequency of incidence. The bins are then transformed into binary sub-trees, where the leaf nodes of the binary sub-trees comprise the symbols of the bin associated with the binary sub-trees. The binary sub-trees are then combined via nesting, thereby creating a coarse grained binary tree, where all leaves are mapped to a specified number of depths. The coarse grained binary tree is then traversed, thereby yielding a canonical code for each symbol, thereby defining the entries for a dynamic Huffman table.

25 Claims, 6 Drawing Sheets

METHOD OF CONSTRUCTING AN APPROXIMATED DYNAMIC HUFFMAN TABLE FOR USE IN DATA COMPRESSION

FIELD OF THE INVENTION

The present invention relates to the field of data compression, and more particularly relates to a method of constructing a coarse grained approximation of a Dynamic Huffman Table.

SUMMARY OF THE INVENTION

There is thus provided in accordance with the invention, a method of generating an approximated dynamic Huffman table, the method comprising the steps of extracting a sample comprising a subset of data to be compressed, generating a coarse grained binary tree representing the frequency of symbols found in the extracted sample in a first computer process and providing the coarse grained binary tree to a second computer process, deriving a unique canonical code for each symbol from the master binary tree in the second computer process and storing each derived unique canonical code in a computer readable storage medium for use in subsequent compression of the data.

There is also provided in accordance of the invention, a computer program for generating an approximated dynamic Huffman table, the computer program product comprising a computer usable medium having computer usable code embodied therewith, the computer usable program code comprising computer usable code configured for extracting a sample comprising a subset of data to be compressed, computer usable code configured for generating a coarse grained binary tree representing the frequency of symbols found in the extracted sample in a first computer process and providing the coarse grained binary tree to a second computer process, computer usable code configured for deriving a unique canonical code for each symbol from the master binary tree in the second computer process and computer usable code configured for storing each derived unique canonical code in a computer readable storage medium for use in subsequent compression of the data.

There is further provided in accordance of the invention, a method of generating an approximated dynamic Huffman table, the method comprising the steps of assigning each symbol from input data to one of a plurality of bins in accordance with a frequency of the symbol observed in the input data in a first computer process and providing the plurality of bins to a second computer process, defining a binary sub-tree for each of the plurality of bins in the second computer process and providing the plurality of defined binary sub-trees to a third computer process, populating leaves of each binary sub-tree with all symbols from its associated bin in the third computer process and providing the plurality of populated binary sub-trees to a fourth computer process, combining the plurality of defined binary sub-trees into a binary tree in the fourth computer process and providing the binary tree to a fifth computer process, deriving a unique canonical code for each symbol from the master binary tree in the fifth computer process and storing each derived unique canonical code in a computer readable storage medium for use in subsequent compression of the data.

There is also provided in accordance of the invention, a computer program for generating an approximated dynamic Huffman table, the computer program product comprising a computer usable medium having computer usable code embodied therewith, the computer usable program code comprising computer usable code configured for assigning each symbol from input data to one of a plurality of bins in accordance with a frequency of the symbol observed in the input data in a first computer process and providing the plurality of bins to a second computer process, computer usable code configured for defining a binary sub-tree for each of the plurality of bins in the second computer process and providing the plurality of defined binary sub-trees to a third computer process, computer usable code configured for populating leaves of each binary sub-tree with all symbols from its associated bin in the third computer process and providing the plurality of populated binary sub-trees to a fourth computer process, computer usable code configured for combining the plurality of defined binary sub-trees into a binary tree in the fourth computer process and providing the binary tree to a fifth computer process, computer usable code configured for deriving a unique canonical code for each symbol from the master binary tree in the fifth computer process and computer usable code configured for storing each derived unique canonical code in a computer readable storage medium for use in subsequent compression of the data.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document:

| Term | Definition |
|---|---|
| ASCII | American Standard Code for Information Interchange |
| ASIC | Application Specific Integrated Circuit |
| CD-ROM | Compact Disc Read Only Memory |
| CPU | Central Processing Unit |
| DSP | Digital Signal Processor |
| EEROM | Electrically Erasable Read Only Memory |
| EPROM | Erasable Programmable Read-Only Memory |

-continued

| Term | Definition |
|------|------------|
| FPGA | Field Programmable Gate Array |
| FTP | File Transfer Protocol |
| HTTP | Hyper-Text Transport Protocol |
| I/O | Input/Output |
| LAN | Local Area Network |
| NIC | Network Interface Card |
| RAM | Random Access Memory |
| RF | Radio Frequency |
| ROM | Read Only Memory |
| SAN | Storage Area Network |
| URL | Uniform Resource Locator |
| WAN | Wide Area Network |

DETAILED DESCRIPTION OF THE INVENTION

The present invention is a method of constructing a fast approximation of a dynamic Huffman table from a data sample comprising a subset of data to be compressed. The frequency of incidence of each symbol in the sample is calculated, and the symbols are then allocated to predefined bins based on their frequency of incidence. Bins are then transformed into binary sub-trees, where the leaf nodes of the binary sub-trees comprise the symbols of the bin associated with the binary sub-trees. The binary sub-trees are then combined (via nesting), thereby creating a coarse grained binary tree, where all leaves are mapped to a specified number of depths. The resulting coarse grained binary tree is then traversed, thereby yielding a canonical code for each symbol, thereby defining the entries for a dynamic Huffman table. In addition to raw data, fast approximated dynamic Huffman tables constructed using the method of the present invention is also operative to compress Lempel-Ziv length-distance pair information.

The present invention is operative to aid in the design of data compression systems which both yield greater compression ratios than data compression systems utilizing static Huffman tables and having less latency than data compression systems utilizing dynamic Huffman tables. Latency is reduced by constructing a coarse grained binary tree (i.e. as opposed to binary tree with a greater number of depth levels, representing statistical wealth) and constructing the fast approximated dynamic Huffman table from a sample of the data to be compressed (i.e. as opposed to analyzing the entire data).

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
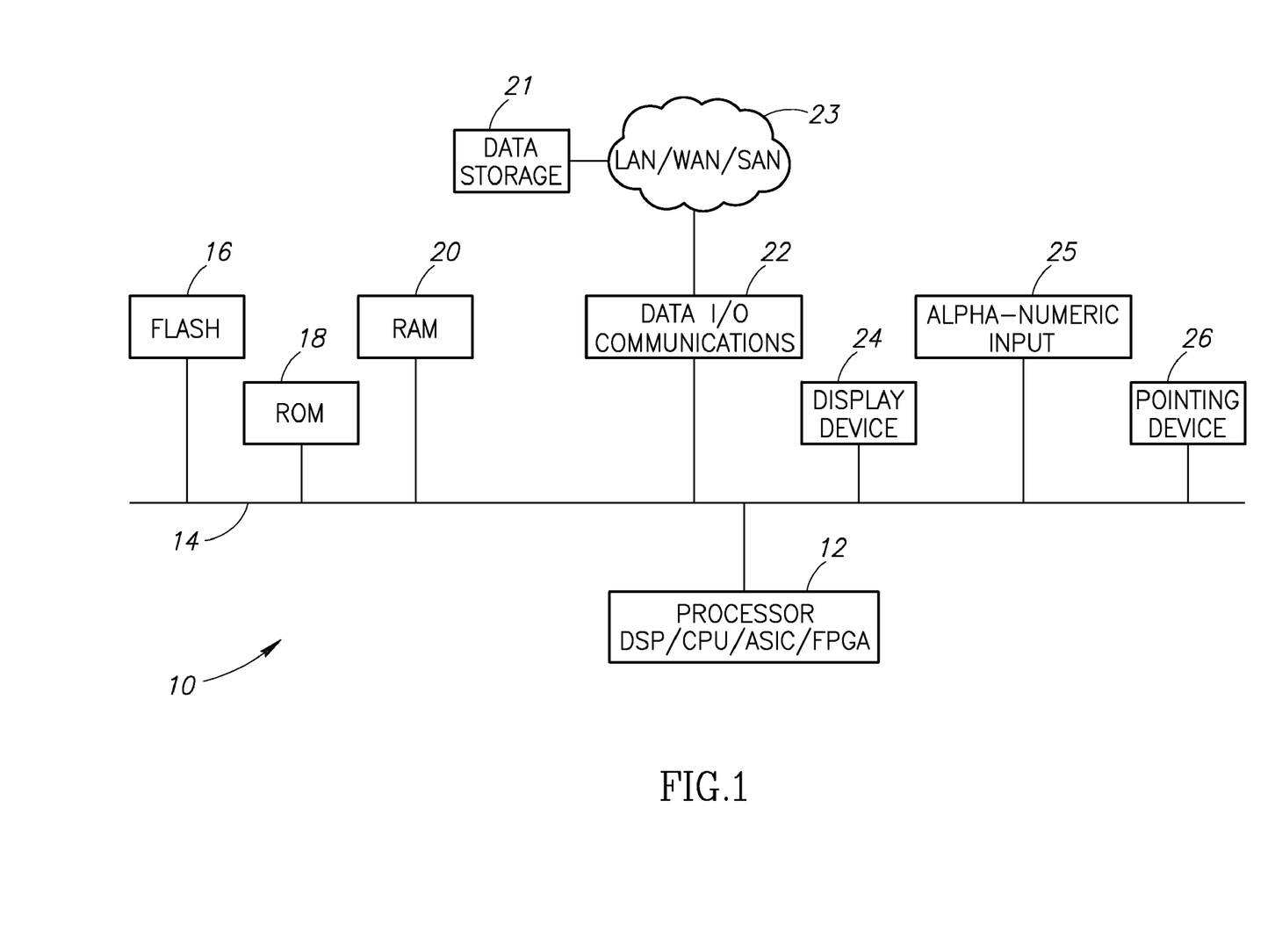
FIG. 1 is a block diagram illustrating an example computer processing system adapted to implement the approximated dynamic Huffman table construction method of the present invention.

A block diagram illustrating an example computer processing system adapted to implement the fast approximated dynamic Huffman table creation method of the present invention is shown in FIG. 1. The computer system, generally referenced 10, comprises a processor 12 which may comprise a digital signal processor (DSP), central processing unit (CPU), microcontroller, microprocessor, microcomputer, ASIC or FPGA core. The system also comprises static read only memory 18 and dynamic main memory 20 all in communication with the processor. The processor is also in communication, via bus 14, with a number of peripheral devices that are also included in the computer system. Peripheral devices coupled to the bus include a display device 24 (e.g., monitor), alpha-numeric input device 25 (e.g., keyboard) and pointing device 26 (e.g., mouse, tablet, etc.)

The computer system is connected to one or more external networks such as a LAN or WAN 23 via communication lines connected to the system via data I/O communications interface 22 (e.g., network interface card or NIC). The network adapters 22 coupled to the system enable the data processing system to become coupled to other data processing systems or remote printers or storage devices through intervening private or public networks. Modems, cable modem and Ethernet cards are just a few of the currently available types of network adapters. The system also comprises magnetic or semiconductor based storage device 21 for storing application programs and data. The system comprises computer readable storage medium that may include any suitable memory means, including but not limited to, magnetic storage, optical storage, semiconductor volatile or non-volatile memory, biological memory devices, or any other memory storage device.

Software adapted to implement the fast approximated dynamic Huffman table creation method of the present invention is adapted to reside on a computer readable medium, such as a magnetic disk within a disk drive unit. Alternatively, the computer readable medium may comprise a floppy disk, removable hard disk, Flash memory 16, EEROM based memory, bubble memory storage, ROM storage, distribution media, intermediate storage media, execution memory of a computer, and any other medium or device capable of storing for later reading by a computer a computer program implementing the method of this invention. The software adapted to implement the fast approximated dynamic Huffman table creation method of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the fast approximated dynamic Huffman table creation method of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk or CD-ROM or may be downloaded over a network such as the Internet using FTP, HTTP, or other suitable protocols. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Fast Approximated Dynamic Huffman Table Creation Method

In accordance with the invention, an array of symbol counters and an array of bin counters are first defined. Each symbol counter array element comprises (1) a symbol, (2) a counter indicating the number of occurrences of the symbol in the analyzed data and (3) a pointer to a specific bin counter. Each sample of data to be compressed is loaded to a compression system. In an alternative embodiment, the symbols are implied by their respective array index (i.e. each array element references the ASCII value of the array index). Each bin counter array element comprises (1) a bin identifier and (2) a lower threshold and (3) an upper threshold. The lower and upper threshold comprises a range indicating a number of occurrences for a symbol associated with a bin. In an alternative embodiment, the bin number can be inferred by its respective array index.

Figure 2:
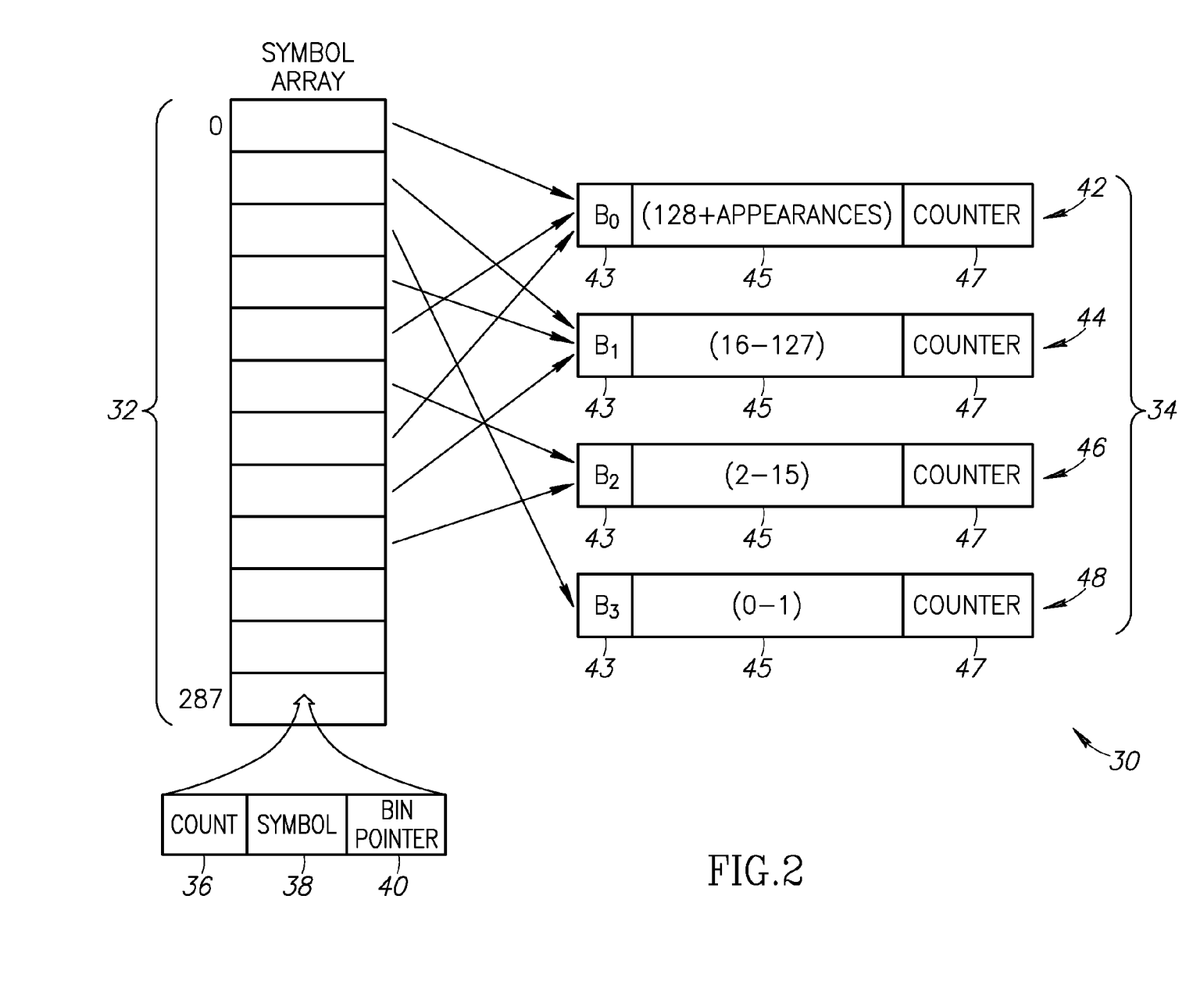
FIG. 2 is a diagram illustrating an example of symbol counters and bin counters used to implement the approximated dynamic Huffman table construction method of the present invention.

An example of arrays of symbol and bin counters is shown in FIG. 2. The diagram, generally referenced 30, comprises symbol array 32 and bin array 34. Each symbol array element comprises a symbol counter 36, symbol identifier 38 and bin pointer 40. Bin array 34 comprises bins (i.e. array elements) B0 42, B1 44, B2 46 and B3 48. Each bin array element comprises bin identifier 43 numeric range 45 and bin counter 47. The numeric range indicates an observed frequency of incidence for symbols associated with a particular bin (e.g., 0-1 for B3 and 2-15 for B2).

In operation, all symbol counters initially point to bin counter B3, since the numeric range associated with B3 is 0-1 observed incidences of a particular symbol. The bin counter associated with B3 is initialized to the number of array elements in the symbol array and all other bin counters are initialized to zero.

When a character is read (i.e. from the data analyzed to create the approximated dynamic Huffman table), the symbol array element with the matching symbol identifier is located and the symbol counter associated with the symbol identifier is incremented by one. If the symbol counter exceeds the upper threshold of the current bin, then the bin counter currently associated with the symbol identifier is decremented by one, the bin pointer is updated to point to the bin with the next higher numeric range (e.g., from bin B3 to bin B2) and the bin counter now associated with the symbol identifier is incremented by one.

In this example, the symbol counter array has 288 elements. Aside from the 256 ASCII characters, this symbol counter array has 32 elements reserved for Lempel-Ziv length-distance pair data. Note that it is possible that the counter of one or more symbols (i.e. ASCII) will remain zero (i.e. there was no observed incidence of that particular symbol in the data). This can be due to either (1) using a sample (i.e. a subset) of the data to be compressed, where those symbols have no occurrence or (2) a file that by definition will only use a specific number of symbols (e.g., a plain text file). In the latter case, symbols with zero occurrences can be dropped from the symbol array, thereby reducing the size of the resulting fast approximated dynamic Huffman table.

After the symbol counter and bin counter arrays are populated, binary sub-trees are defined for each bin. The first step is to ensure that each bin (except for the last bin, i.e. the bin associated with the lowest numeric range) has a valid bin counter, and therefore represents a valid number of symbols. This optimizes the structure of the binary tree which will yield compression codes, since the leaf nodes of each binary sub-tree (except for the last) will comprise either a symbol associated with that bin or a node of a nested sub-tree. The leaf nodes of the last sub-tree will only comprise symbols associated with that bin. This step ensures that all leaves of parent sub-trees in the resulting binary tree are populated by either a symbol associated with the binary sub-tree (i.e. the bin) or nodes of a nested sub-tree.

To validate the number of elements in a bin, the formula $$|B_i| + 2^x = 2^y \quad (1)$$

is used, where $|B_i|$ is the current bin counter value, and x and y can be any positive integer value. For example, if $|B_i|=6$ is valid, since $6+2^1=2^3$, but $|B_i|=5$ is not valid, since there is no integer x that will yield $2^y$, where y is also an integer value. In the event $B_i$ is not valid, the number of elements in the current bin needs to be adjusted. This is accomplished by either (1) borrowing an appropriate number of symbols from the bin associated with the next higher numeric range and (i.e. increasing the number of symbols in the current bin) or (2) rejecting an appropriate number of symbols to the bin associated with the next higher numeric range (i.e. reducing the number of symbols in the current bin). In either case symbol pointers and bin counters are updated accordingly. For example, in the case where $|B_1|=5$, a symbol from B2 is transferred (i.e. borrowed) to B1, in order that $|B_1|=6$.

After the bin counters are normalized, a value is calculated representing the depth from the root node of the binary tree to the leaf nodes of each binary sub-tree. The depth of the leaves of each sub-tree which is a parent sub-tree (i.e. all sub-trees except for the last one) is calculated as $$d_i = d_{i-1} - \left\lceil \log_2\left(2^{d_{i-1}} - \sum_{j=0}^{i-1} |B_j|\right) \right\rceil + \lceil \log_2(|B_i|+1) \rceil \quad (2)$$

Where d represents the depth, i represents the current bin/sub-tree and $|B_i|$ is the bin counter value associated with bin i. The depth of the entire binary tree (i.e. the depth of the leaves of the binary sub-tree which has no child sub-tree) is calculated as $$d_i = d_{i-1} - \left\lceil \log_2\left(2^{d_{i-1}} - \sum_{j=0}^{i-1} |B_j|\right) \right\rceil + \lceil \log_2(|B_i|) \rceil \quad (3)$$

Figure 3:
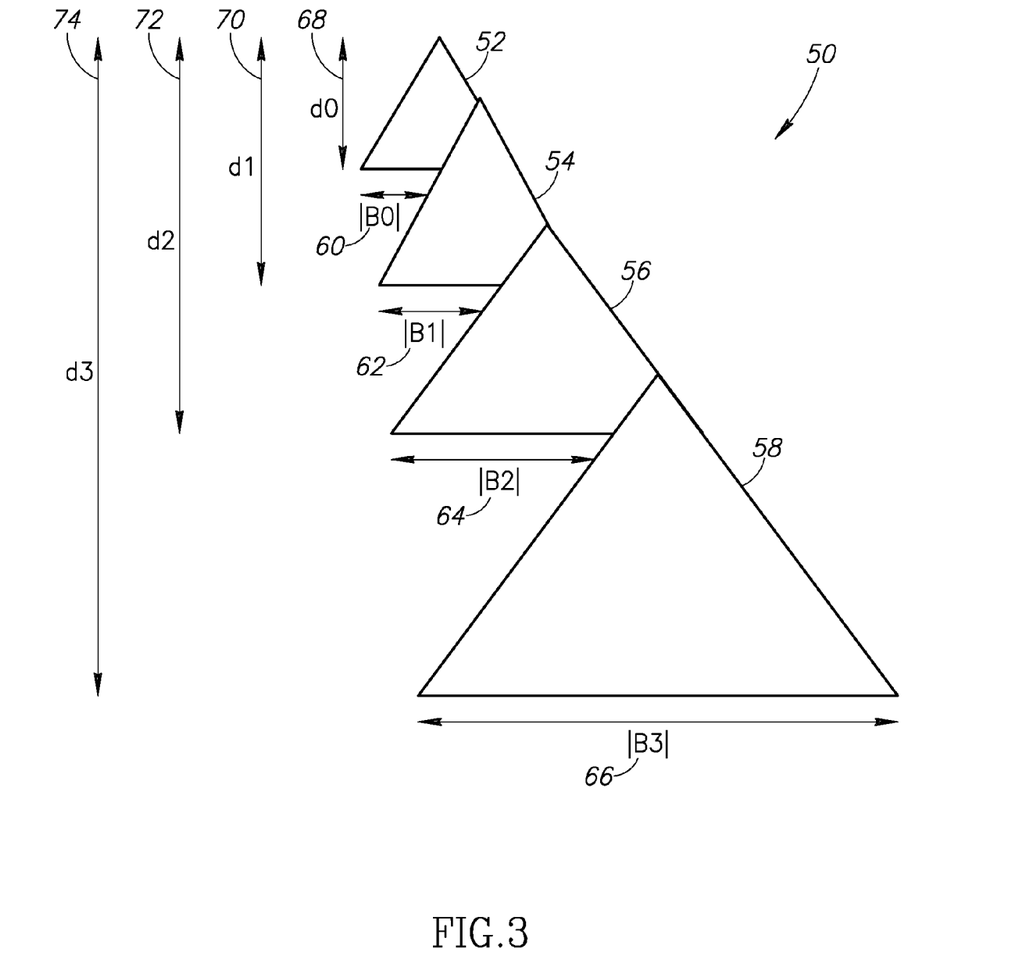
FIG. 3 is a diagram illustrating an example of nested binary sub-trees used to implement the approximated dynamic Huffman table construction method of the present invention.

An example of nested binary sub-trees is shown in FIG. 3. The binary tree, generally referenced 50 comprises binary sub-trees 52, 54, 56, 58, bin counters B0 60, B1 62, B2 64, B3 66 and sub-tree depths d0 68, d1 70, d2 72, d3 74. Binary tree 52 has (bin counter) B0 leaf node values and has binary sub-tree 54 nested within it. The depth of the leaf nodes of binary sub-tree 52 is d0. Binary sub-tree 54 has B1 leaf nodes and has binary sub-tree 56 nested within it. The depth of the leaf nodes of binary sub-tree 54 is d1. Binary sub-tree 56 has B2 leaf nodes and has binary sub-tree 58 nested within it. The depth of the leaf nodes of binary sub-tree 56 is d2. Binary sub-tree 58 has B3 leaf nodes and has no child sub-tree nested within it. The depth of the leaf nodes of binary sub-tree 56 is d3.

After generating the binary tree, the dynamic Huffman table codes are generated and stored in a computer readable storage medium, for use in subsequent compression of the data. Dynamic Huffman table code generation is performed by first associating the leaf nodes of each binary sub-tree with the symbols of the corresponding bin. The binary tree is then traversed from the root node to each leaf node, thereby generating a canonic (binary) code for each symbol.

Figure 4:
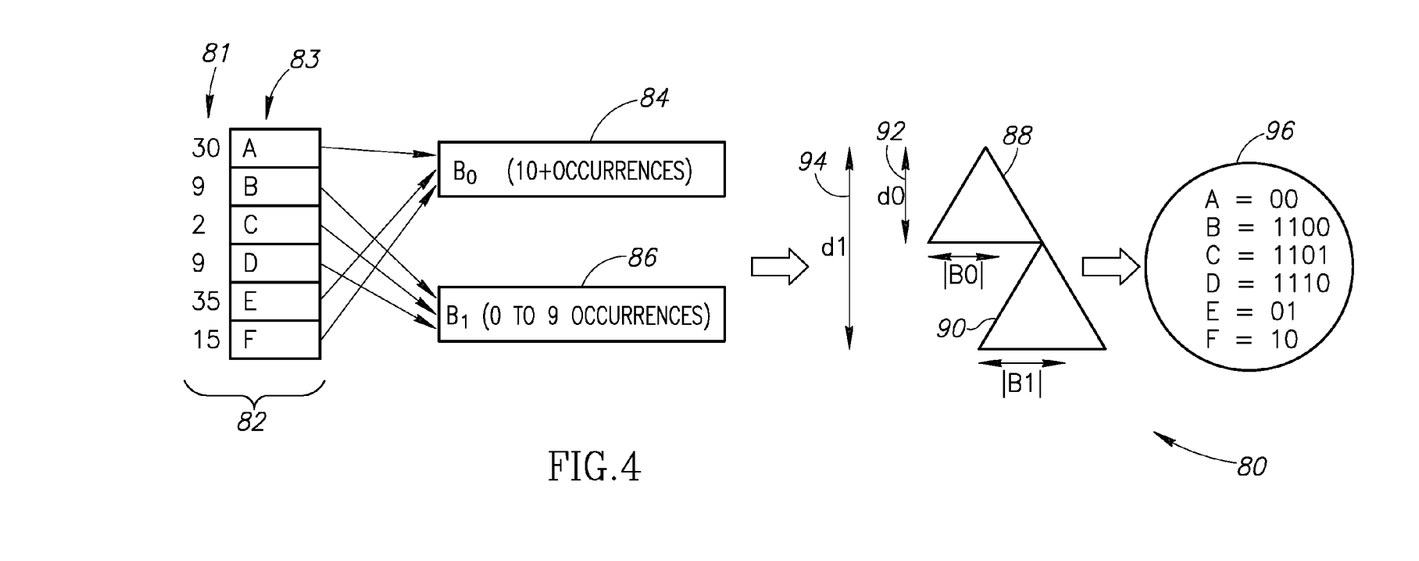
FIG. 4 is a diagram illustrating an example of generating dynamic Huffman table codes using the approximated dynamic Huffman table construction method of the present invention.

A simple example implementing the method of the present invention is shown in FIG. 4. The diagram, generally referenced 80, comprises symbol array 82, bins B0 84, B1 86, binary sub-trees 88, 90, binary tree depths d0 92, d1 94 and results 96. Symbol array 82 comprises symbol counters 81 and symbol identifiers 83. In this example, the symbol array contains 6 symbols (in this case letters A, B, C, D, E and F) and their corresponding counts in the data. The numeric range for B1 is 0-9 occurrences, and therefore is associated with symbols B, C and D. The numeric range for B2 is 10+ occurrences, and therefore is associated with symbols A, E and F.

In this example $|B_0|==3$, which generates an acceptable value for Equation (1), since $|B_0|+2^0=3+1=2^2$. $d_0$ is then calculated from Equation (2) as $\log_2(3+1)=\log(4)=2$. $|B1|==3$, which is valid, since it is the last bin (i.e. no check is necessary), and Equation (3) is used to calculate $d_1=d_0-\log_2(2^{d0}-|B0|)+\log_2(|B1|)=2-\log_2(2^2-3)+\log_2(3)=2-0+2=4$.

Depth d1 comprises the depth sub-tree 88 is hanged plus the depth of sub-tree 90. At this point the binary tree (comprising the two binary sub-trees) is generated, have established that the leaf nodes of both binary sub-trees will reference three symbols each, and their related sub-tree depths. Leaves of the binary tree are then referenced to their associated symbols and the canonic codes 96 are then generated (i.e. by traversing the binary tree to the leaf node associated with each symbol) for the dynamic Huffman table.

Figure 5:
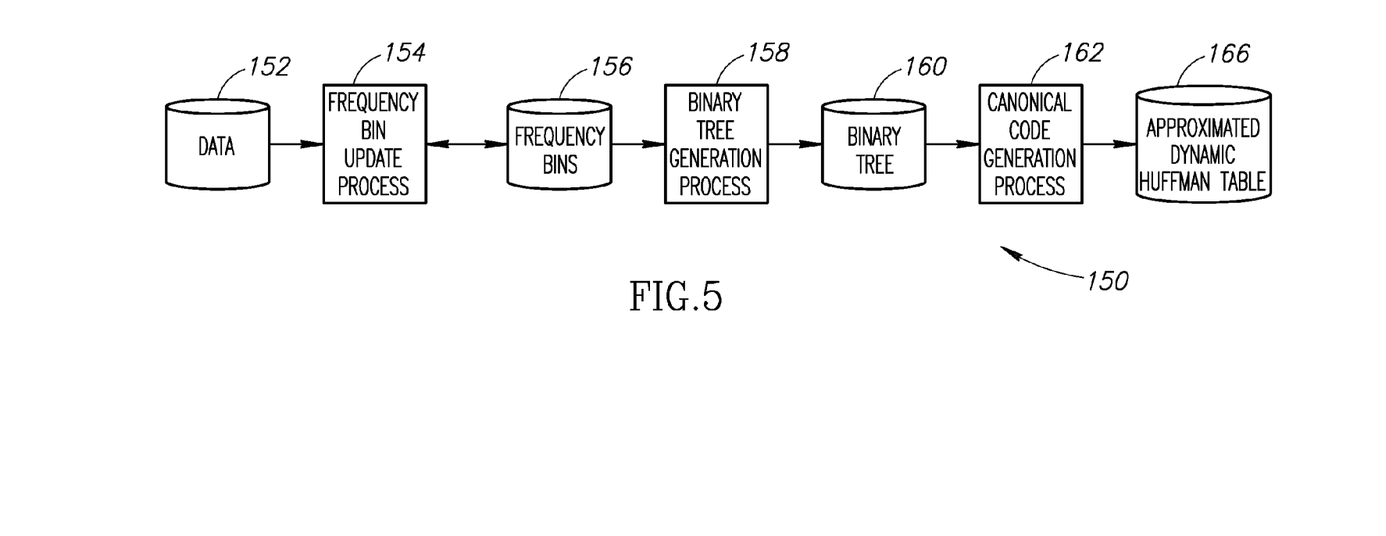
FIG. 5 is a functional block diagram illustrating an example computer processing system implementing the approximated dynamic Huffman table construction method of the present invention.

A functional block diagram illustrating an example computer processing system implementing the approximated dynamic Huffman table construction method of the present invention is shown in FIG. 5. The computer system, generally referenced 150 comprises data storage subsystem 152, frequency bin update processing subsystem 154, frequency bin storage subsystem 156, binary tree generation processing subsystem 158, binary tree storage subsystem 160, canonical code generation processing subsystem 162 and approximated dynamic Huffman table storage subsystem 166.

In operation, data to be compressed resides on the data storage subsystem. The frequency bin update processing subsystem loads a sample of the data to be compressed, updates the symbol and bin counters and stores the bins (i.e. the bin array elements discussed supra) in the frequency bin storage subsystem. The binary tree generation processing subsystem then retrieves the bins, generates a binary sub-tree for each bin, combines the binary sub-trees into a coarse grained binary tree representing the frequency of symbols found in the loaded sample and stores the coarse grained binary tree is in the binary tree storage subsystem. The canonical code generation processing system then reads the stored coarse grained binary tree, derives the canonical code representing each unique symbol contained in the loaded sample and creates an approximated dynamic Huffman table which is stored in the approximated dynamic Huffman table storage subsystem.

Figure 6:
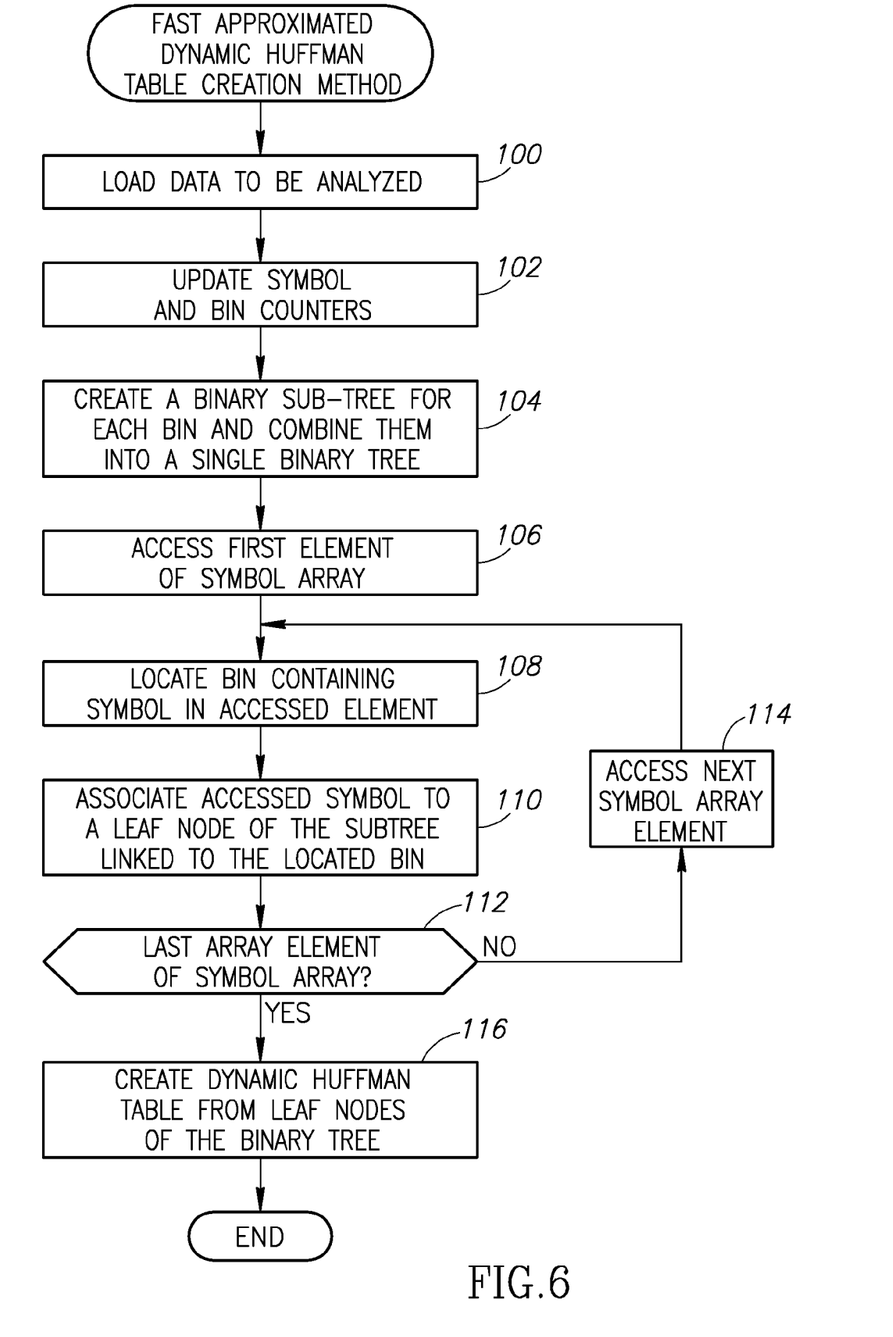
FIG. 6 is a flow diagram illustrating the fast approximated dynamic Huffman table construction method of the present invention.

A flow diagram illustrating the fast approximated dynamic Huffman table creation method of the present invention is shown in FIG. 6. First, the file to be compressed is loaded (step 100), and the symbol counter and bin counters are updated (step 102). A binary sub-tree is then defined for each bin, and the sub-trees are combined (i.e. nested) to create a single binary tree (step 104). The first element of the symbol array is accessed (step 106), and the bin containing the symbol referenced by the symbol array element is located (step 108). The accessed symbol is then associated with a leaf node of the binary sub-tree linked to the located bin (step 110). If the last element of the symbol array has not yet been accessed (step 112) then the next element of the symbol array is accessed (step 114) and the method of the present invention continues with step 108. If the current accessed element is the last element of the symbol array, then a dynamic Huffman table is created from the leaf nodes of the binary tree comprised of the created binary sub-trees (step 116). The dynamic Huffman table created is stored in a computer readable storage medium, such as magnetic storage, optical storage, semiconductor volatile or non-volatile memory, biological memory devices or any other memory storage device.

Note that in alternative embodiments, enumerating the symbols associated with each sub-tree can be executed as an independent task (i.e. a separate task for each sub-tree), and can be performed in parallel. The task to enumerate the symbols associated with each sub-tree can also be initiated upon the definition of each sub-tree (i.e. also performed in parallel with the definition of the next sub-tree).

Figure 7:
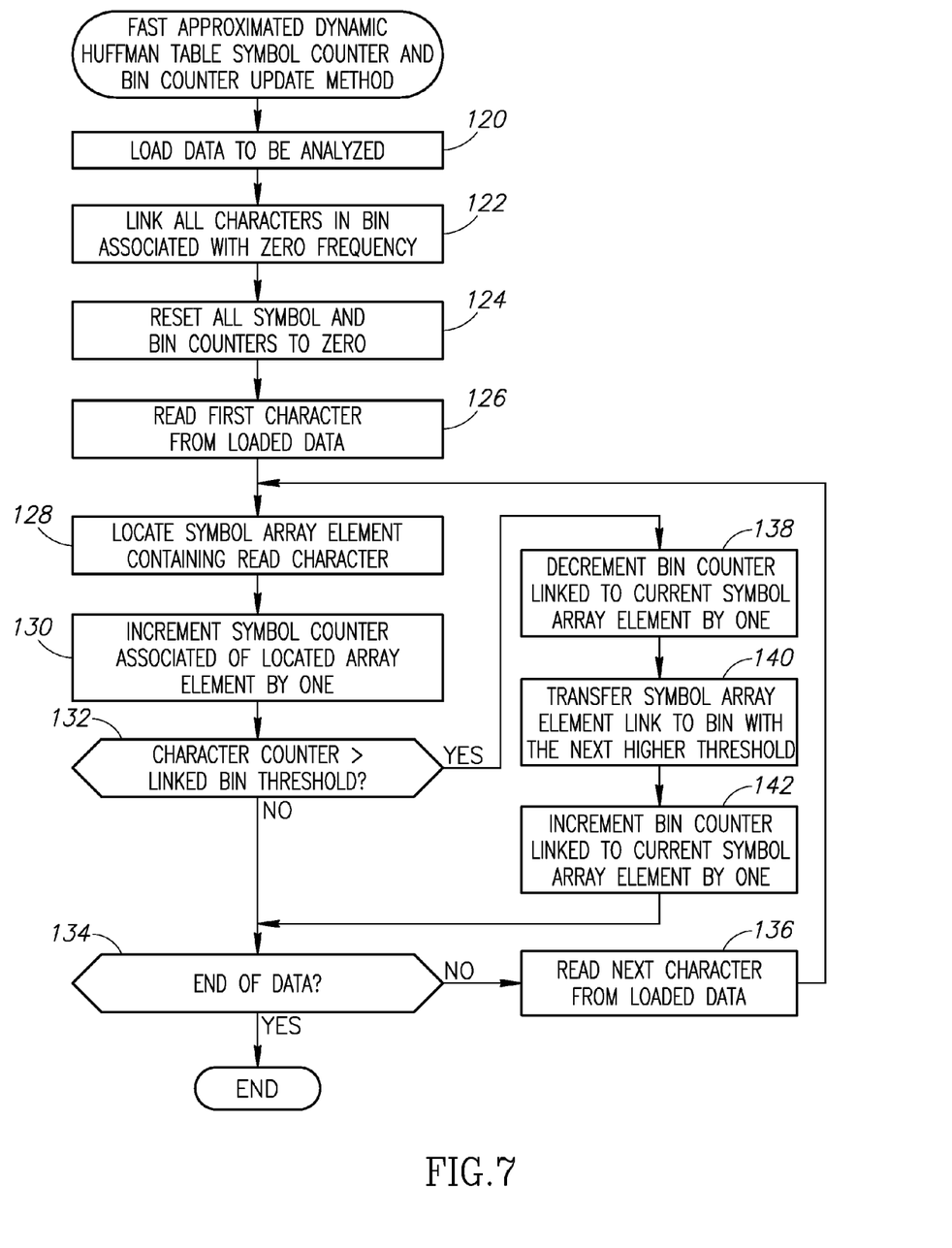
FIG. 7 is a flow diagram illustrating fast approximated dynamic Huffman table symbol counter and bin counter update method of the present invention.

A flow diagram illustrating fast approximated dynamic Huffman table symbol counter and bin counter update method of the present invention is shown in FIG. 7. First, the data to be analyzed (i.e. the data to be compressed or a sample of the data to be compressed) is loaded (step 120). Initially, all symbols are linked to the bin associated with zero frequency (step 122), and all symbol counters and bin counters are initialized to zero (step 124). The first character from the data is read (step 126), and the symbol array element associated with the read character is located (step 128). The located array element symbol counter is then incremented by one (step 130). If the current symbol counter value is not greater than the current bin threshold (step 132) and end of the data (i.e. the data to be compressed or a sample of the data to be compressed) has not been reached (step 134), then the next character is read (step 136), and the method of the present invention continues with step 128. If the current symbol counter value is greater than the current bin threshold, then the bin counter currently linked to the current symbol is decremented by one (step 138), the link from the current symbol is transferred to the bin with the next higher threshold (step 140) and the bin counter of the bin now linked to the current symbol is incremented by one (step 142). Finally, once all the data has been read (step 134), the method of the present invention is complete.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of generating an approximated dynamic Huffman table, the method comprising the steps of:
    extracting a sample comprising a subset of data to be compressed;
    generating a coarse grained binary tree representing the frequency of symbols found in said extracted sample in a first computer process and providing said coarse grained binary tree to a second computer process;
    deriving a unique canonical code for each said symbol from a master binary tree in said second computer process; and
    storing each said derived unique canonical code in a computer readable storage medium for use in subsequent compression of said data.

2. The method according to claim 1, wherein said step of generating comprises:
    assigning each symbol from said sample to one of a plurality of bins in accordance with a frequency of each said symbol observed in said sample;
    defining a binary sub-tree for each of said plurality of bins;
    populating leaves of each binary sub-tree with all symbols from its associated bin; and
    combining said plurality of defined binary sub-trees into a binary tree.

3. The method according to claim 2, wherein said plurality of bins are differentiated by a numeric range indicating a frequency of said symbols observed in said input data.

4. The method according to claim 2, wherein said step of combining comprises the steps of:
ranking said binary sub-trees in descending order according to a frequency value associated with each said bin;
implementing the highest ranked binary sub-tree as a root of said master binary sub-tree; and
nesting each subsequently ranked binary sub-tree into a binary sub-tree with the next highest ranking.

5. The method according to claim 2, wherein a maximum depth value is defined for said master binary tree.

6. The method according to claim 1, wherein said step of generating a unique canonical code for each said symbol comprises recording a plurality of consecutive binary values identified by traversing said master binary tree from its root node to a leaf node associated with each said symbol.

7. A computer program product for generating an approximated dynamic Huffman table, the computer program product comprising:
a computer usable medium having computer usable code embodied therewith, execute by a processor the computer usable program code comprising:
computer usable code configured for extracting a sample comprising a subset of data to be compressed;
computer usable code configured for generating a coarse grained binary tree representing the frequency of symbols found in said extracted sample in a first computer process and providing said coarse grained binary tree to a second computer process;
computer usable code configured for deriving a unique canonical code for each said symbol from a master binary tree in said second computer process; and
computer usable code configured for storing each said derived unique canonical code in a computer readable storage medium for use in subsequent compression of said data.

8. The computer program product according to claim 7, wherein computer usable code configured for generating comprises:
computer usable code configured for assigning each symbol from said sample to one of a plurality of bins in accordance with a frequency of each said symbol observed in said sample;
computer usable code configured for defining a binary sub-tree for each of said plurality of bins;
computer usable code configured for populating leaves of each binary sub-tree with all symbols from its associated bin; and
computer usable code configured for combining said plurality of defined binary sub-trees into a binary tree.

9. The computer program product according to claim 8, wherein said plurality of bins are differentiated by a numeric range indicating a frequency of said symbols observed in said input data.

10. The computer program product according to claim 8, wherein said computer usable code configured for combining comprises the steps of:
computer usable code configured for ranking said binary sub-trees in descending order according to a frequency value associated with each said bin;
computer usable code configured for computer usable code configured for implementing the highest ranked binary sub-tree as a root of said master binary sub-tree; and
computer usable code configured for nesting each subsequently ranked binary sub-tree into a binary sub-tree with the next highest ranking.

11. The computer program product according to claim 8, wherein a maximum depth value is defined for said master binary tree.

12. The computer program product according to claim 7, wherein said computer usable code configured for generating a unique canonical code for each said symbol comprises computer usable code configured for recording a plurality of consecutive binary values identified by traversing said master binary tree from its root node to a leaf node associated with each said symbol.

13. A method of generating an approximated dynamic Huffman table, the method comprising the steps of:
assigning each symbol from input data to one of a plurality of bins in accordance with a frequency of said symbol observed in said input data in a first computer process and providing said plurality of bins to a second computer process;
defining a binary sub-tree for each of said plurality of bins in said second computer process and providing said plurality of defined binary sub-trees to a third computer process;
populating leaves of each binary sub-tree with all symbols from its associated bin in said third computer process and providing said plurality of populated binary sub-trees to a fourth computer process;
combining said plurality of defined binary sub-trees into a binary tree in said fourth computer process and providing said binary tree to a fifth computer process;
deriving a unique canonical code for each said symbol from a master binary tree in said fifth computer process; and
storing each said derived unique canonical code in a computer readable storage medium for use in subsequent compression of said data.

14. The method according to claim 13, wherein said input data comprises a subset of data to be compressed utilizing said approximated dynamic Huffman table.

15. The method according to claim 13, wherein said input data comprises compression encoding information.

16. The method according to claim 13, wherein said plurality of bins are differentiated by a numeric range indicating a frequency of each said symbol observed in said input data.

17. The method according to claim 13, wherein said step of combining comprises the steps of:
ranking said binary sub-trees in descending order according to a frequency value associated with each said binary sub-tree;
implementing the highest ranked binary sub-tree as a root of said master binary sub-tree; and
nesting each subsequently ranked binary sub-tree into a binary sub-tree with the next highest ranking.

18. The method according to claim 13, wherein a maximum depth value is defined for said master binary tree.

19. The method according to claim 13, wherein said step of deriving comprises recording a plurality of consecutive binary values identified by traversing said master binary tree from its root node to a leaf node associated with each said symbol.

20. A computer program product for generating an approximated dynamic Huffman table, the computer program product comprising:
a computer usable medium having computer usable code embodied therewith, execute by a processor the computer usable program code comprising:
computer usable code configured for assigning each symbol from input data to one of a plurality of bins in accordance with a frequency of said symbol observed in said input data in a first computer process and providing said plurality of bins to a second computer process;

computer usable code configured for defining a binary sub-tree for each of said plurality of bins in said second computer process and providing said plurality of defined binary sub-trees to a third computer process;

computer usable code configured for populating leaves of each binary sub-tree with all symbols from its associated bin in said third computer process and providing said plurality of populated binary sub-trees to a fourth computer process;

computer usable code configured for combining said plurality of defined binary sub-trees into a binary tree in said fourth computer process and providing said binary tree to a fifth computer process;

computer usable code configured for deriving a unique canonical code for each said symbol from a master binary tree in said fifth computer process; and computer usable code configured for storing each said derived unique canonical code in a computer readable storage medium for use in subsequent compression of said data.

21. The computer program product according to claim 20, wherein said input data comprises a subset of data to be compressed utilizing said approximated dynamic Huffman table.

22. The computer program product according to c claim 20, wherein said plurality of bins are differentiated by a numeric range indicating a frequency of each said symbol observed in said input data.

23. The computer program product according to claim 20, wherein said computer usable code configured for combining comprises the steps of:
   computer usable code configured for ranking said binary sub-trees in descending order according to a frequency value associated with each said binary sub-tree;
   computer usable code configured for implementing the highest ranked binary sub-tree as a root of said master binary sub-tree; and
   computer usable code configured for nesting each subsequently ranked binary sub-tree into a binary sub-tree with the next highest ranking.

24. The computer program product according to claim 20, wherein a maximum depth value is defined for said master binary tree.

25. The computer program product according claim 20, wherein said computer usable code configured for deriving comprises computer usable code configured for recording a plurality of consecutive binary values identified by traversing said master binary tree from its root node to a leaf node associated with each said symbol.

* * * * *